United States Patent
Koh et al.

(10) Patent No.: US 7,453,317 B2
(45) Date of Patent: Nov. 18, 2008

(54) APPARATUS AND METHOD FOR REDUCING FLICKER NOISE OF CMOS AMPLIFIER

(75) Inventors: Jeong Wook Koh, Seoul (KR); Hyun Soo Chae, Seoul (KR); Hoon Tae Kim, Yongin-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 118 days.

(21) Appl. No.: 11/645,742

(22) Filed: Dec. 27, 2006

(65) Prior Publication Data

US 2007/0159253 A1  Jul. 12, 2007

(30) Foreign Application Priority Data

Dec. 27, 2005  (KR) .................. 10-2005-0130977

(51) Int. Cl.
  *H03F 3/45* (2006.01)
(52) U.S. Cl. ....................... 330/253; 330/261
(58) Field of Classification Search ............. None
  See application file for complete search history.

(56) References Cited

U.S. PATENT DOCUMENTS 4,502,019 A * 2/1985 Van Roermund ............ 330/261
6,559,719 B2 * 5/2003 Sakuragi ..................... 330/252
7,342,452 B2 * 3/2008 Sung et al. .................. 330/261

FOREIGN PATENT DOCUMENTS

| JP | 63-082006 A | 4/1988 |
| JP | 03-241904 A | 10/1991 |
| JP | 2001-284988 A | 10/2001 |
| KR | 20-1998-050644 U | 10/1998 |
| KR | 10-1999-004843 A | 1/1999 |
| KR | 10-1999-0045182 A | 6/1999 |

* cited by examiner

*Primary Examiner*—Robert J. Pascal
*Assistant Examiner*—Krista M Flanagan
(74) *Attorney, Agent, or Firm*—Sughrue Mion, PLLC

(57) ABSTRACT

An apparatus and method of reducing a flicker noise of a CMOS amplifier is provided. In the CMOS amplifier, a load circuit is connected to a signal input circuit which includes two pairs of MOSFETs which simultaneously receive differential signals. In this instance, a first MOSFET included in a switch-bias circuit is connected to one pair of MOSFETs which receive the differential signals and functions as a current source in the case of activation of a clock signal Ø1. A second MOSFET included in the switch-bias circuit is connected to another pair of MOSFETs which receive the differential signals and functions as a current source in the case of activation of a clock signal Ø2.

19 Claims, 10 Drawing Sheets

APPARATUS AND METHOD FOR REDUCING FLICKER NOISE OF CMOS AMPLIFIER

CROSS-REFERENCE TO RELATED APPLICATION

This application claims priority from Korean Patent Application No. 10-2005-01130977, filed on Dec. 27, 2005, in the Korean Intellectual Property Office, the disclosure of which is incorporated herein by reference.

BACKGROUND OF THE INVENTION

1. Field of the Invention

Methods and apparatuses consistent with the present invention relate to a complementary metal-oxide semiconductor (CMOS) amplifier, and more particularly, to an apparatus and method which can reduce a low frequency flicker noise in the CMOS amplifier.

2. Description of Related Art

With increasing developments in the field of a semiconductor technology, the size of devices which constitute a semiconductor circuit, such as a CMOS amplifier, is being reduced. As shown in FIG. 1, a CMOS amplifier 100 in the form of a differential amplifier which amplifies input differential signals V+ and V−, and outputs an amplified signal VOUT, is widely utilized in circuits of almost every field. Currently, a system for transmitting/receiving high speed wireless data, such as a mobile phone, a Digital Multimedia Broadcasting (DMB) phone, a Personal Digital Assistant (PDA), and an Ultra Wideband (UWB), is being developed. Configuration devices of the CMOS amplifier 100 for utilization in the system are also being miniaturized. While the communication system described above requires a high signal-to-noise (SNR) ratio, devices which constitute the CMOS amplifier 100 are being down-scaled and a low frequency flicker noise caused by this physical property, i.e. 1/f noise, is annoying to users. To improve the low frequency noise as described above, a method of enlarging an active area of devices of the CMOS amplifier 100 may be utilized. However, in this case, since parasitic components increase, an operating frequency may be limited.

FIG. 2 illustrates a circuit 200 which is an example of a related art method for reducing the flicker noise of a CMOS amplifier 220. In this instance, the circuit 200 includes mixers 210 and 230 that respectively synthesize a signal RF1 or RF2 which have a certain frequency, in the front and the rear of the CMOS amplifier 220. However, even when utilizing the method as described above, at least one sixth-order low pass filter (LPF) 240 is required to remove a flicker noise such as a glitch from an input signal VIN. Accordingly, the size of the circuit is increased.

FIG. 3 illustrates a circuit 300 which depicts an example of another related art method for reducing the flicker noise of a CMOS amplifier 310. When a clock signal Ø1 is active, the circuit 300 enables an offset to be removed by turning on Metal-Oxide Semiconductor Field Effect Transistors (MOSFETs) M11, M12 and M13 and shorting both ends of a capacitor $C_{AZ}$. After this, when a clock signal Ø2 is active, the circuit 300 enables the input signal VIN to be amplified in the CMOS amplifier 310 by turning on MOSFETs M21 and M22. As described above, a correlated double sampling (CDS) method samples and removes a 1/f noise sampled in the case of activation of the clock signal Ø1. However, it is difficult to process a continuous input signal VIN due to the clock signals Ø1 and Ø2.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a CMOS amplifier which can be applied to the processing of a continuous signal and also can reduce a low frequency flicker noise such as a glitch.

The present invention also provides a method of processing a continuous signal to reduce a low frequency flicker noise.

According to an aspect of the present invention, there is provided an amplifier including: a load circuit connected to a first power source; a signal input circuit connected to the load circuit and which receives two input signals; and a switch-bias circuit connected between a second power source and the signal input circuit, wherein the signal input circuit includes two pairs of Metal-Oxide Semiconductor Field Effect Transistors (MOSFETs) which simultaneously receive the two input signals and are respectively connected to two contact points which are connected to the load circuit. The switch-bias circuit includes a first MOSFET connected to one pair of MOSFETs of the two pairs of MOSFETs and which functions as a current source in the case of activation of a first clock signal, and a second MOSFET connected to another pair of MOSFETs of the two pairs of MOSFETs and which functions as a current source in the case of activation of a second clock signal. The amplifier amplifies the two input signals and outputs the amplified signals via the two contact points connected between the two pairs of MOSFETs of the signal input circuit and the load circuit.

In this instance, each of the first clock signal and the second clock signal is a two phase signal having a different phase with each other. The phase change of the clock signals is substantially simultaneous.

In the case of activation of the first clock signal, the first MOSFET operates according to a bias voltage and the second MOSFET is turned off. Also, in the case of activation of the second clock signal, the second MOSFET operates according to the bias voltage and the first MOSFET is turned off.

The amplifier may be utilized for any one of a buffer, a filter, an integrator, and a comparator.

According to another aspect of the present invention, there is provided a method of processing a consecutive signal, the method including: selectively operating a first MOSFET as a current source according to a first clock signal, the first MOSFET being connected to a pair of MOSFETs connected to a load circuit and receives two input signals; selectively operating a second MOSFET as a current source according to a second clock signal, the second MOSFET being connected to another pair of MOSFETs connected to the load circuit and receives the two input signals; and amplifying the two input signals and outputting the amplified signals via the two contact points between the two pairs of MOSFETs and the load circuit.

BRIEF DESCRIPTION OF THE DRAWINGS

The above and/or other aspects and advantages of the present invention will become apparent and more readily appreciated from the following detailed description, taken in conjunction with the accompanying drawings of which.

DETAILED DESCRIPTION OF EXEMPLARY EMBODIMENTS OF THE INVENTION

Figure 1:
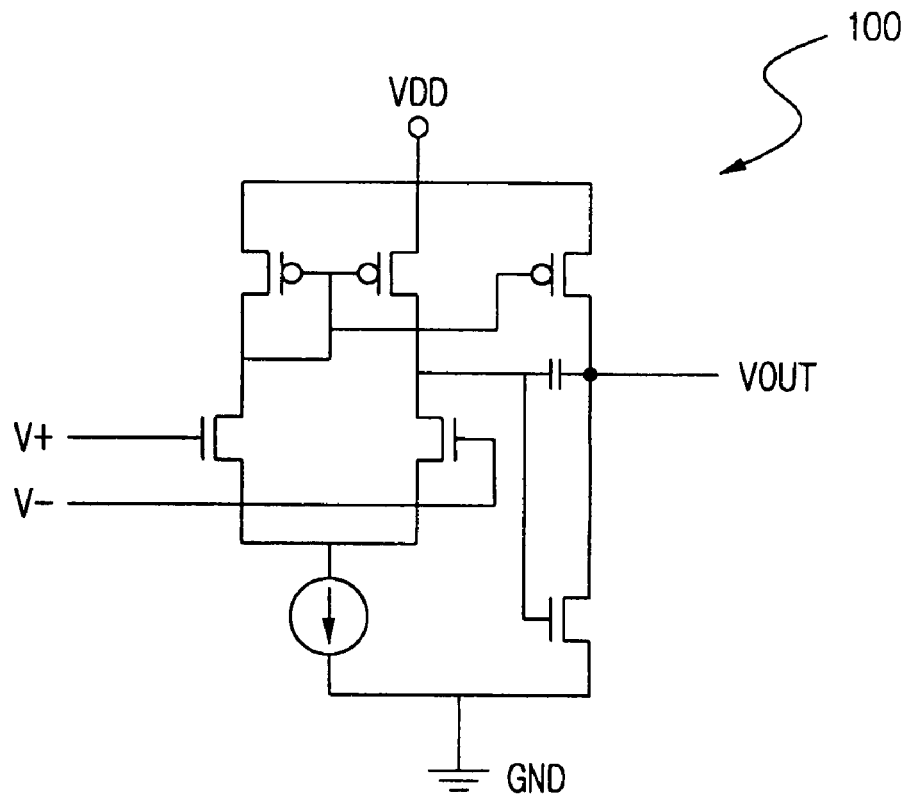
FIG. 1 is a diagram illustrating a structure of a general CMOS amplifier according to a related art.
Figure 2:
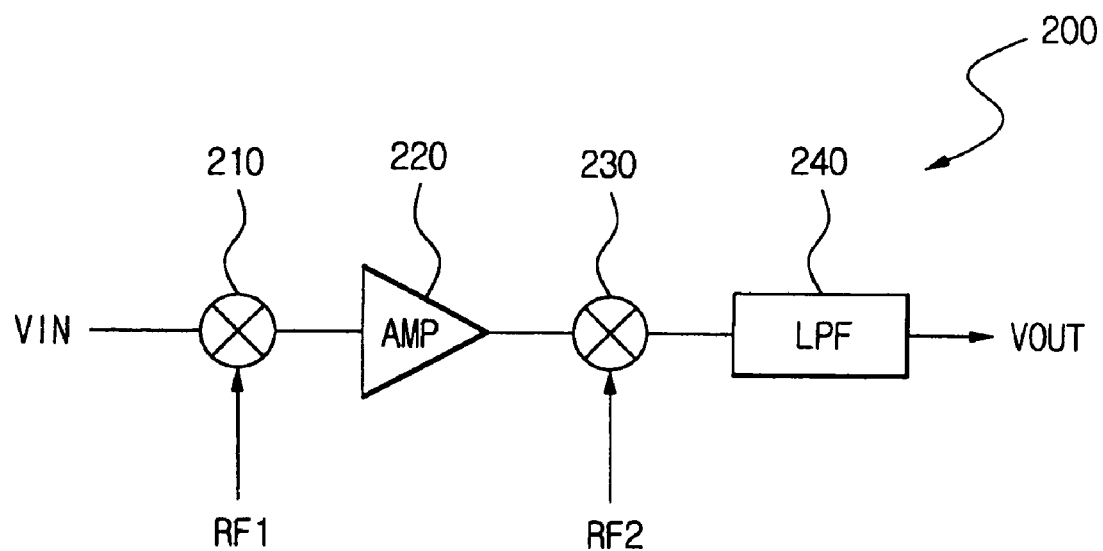
FIG. 2 is a diagram illustrating an example of a related art reducing a flicker noise of a CMOS amplifier according to another conventional art.
Figure 3:
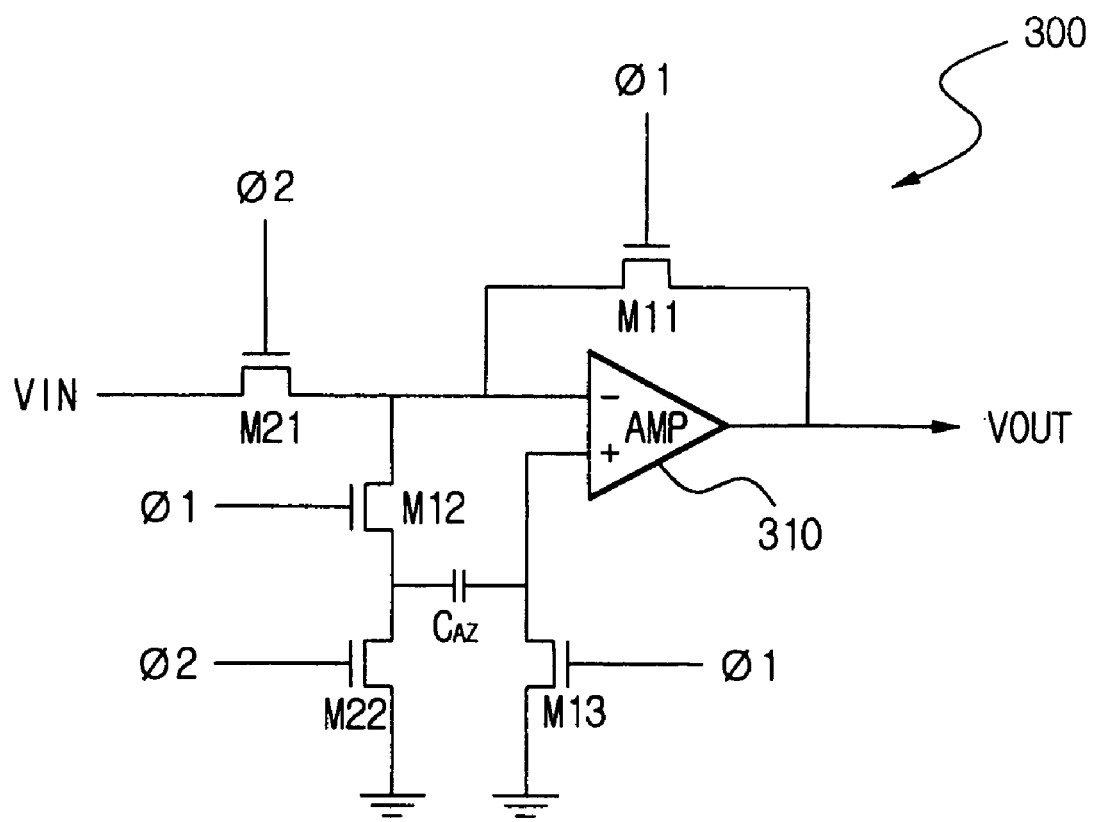
FIG. 3 is a diagram illustrating an example of a conventional art reducing a flicker noise of a CMOS amplifier according to another related art.

Reference will now be made in detail to exemplary embodiments of the present invention, examples of which are illustrated in the accompanying drawings, wherein like reference numerals refer to the like elements throughout. The exemplary embodiments are described below in order to explain the present invention by referring to the figures.

Figure 4:
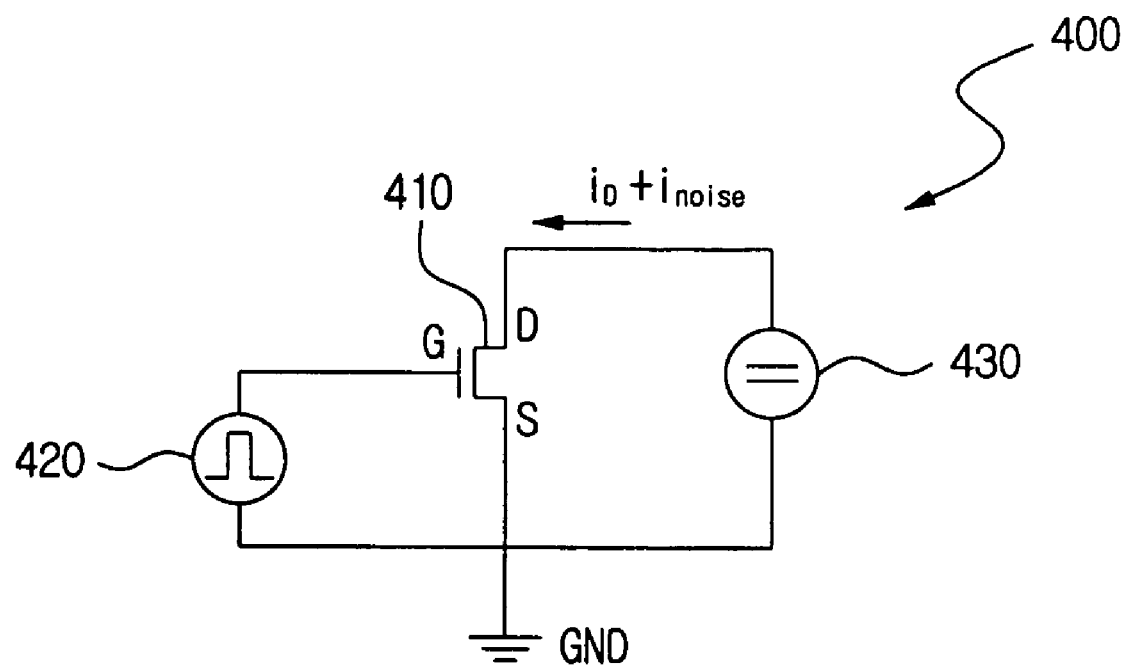
FIG. 4 is a diagram illustrating a circuit for decreasing a flicker noise in a MOSFET according to an exemplary embodiment of the present invention.

FIG. 4 illustrates a circuit 400 for measuring a flicker noise of a MOSFET 410. After driving a gate G of the MOSFET 410 via a clock pulse 420 and supplying a certain current $i_D$ via a certain circuit 430, a current flowing between a drain D and a source S is measured. In this instance, as the gate G of the MOSFET 410 is driven by the clock pulse 420, a current $i_{noise}$ by a 1/f low frequency flicker noise reduces the current flowing between the drain D and the source S.

Figure 5:
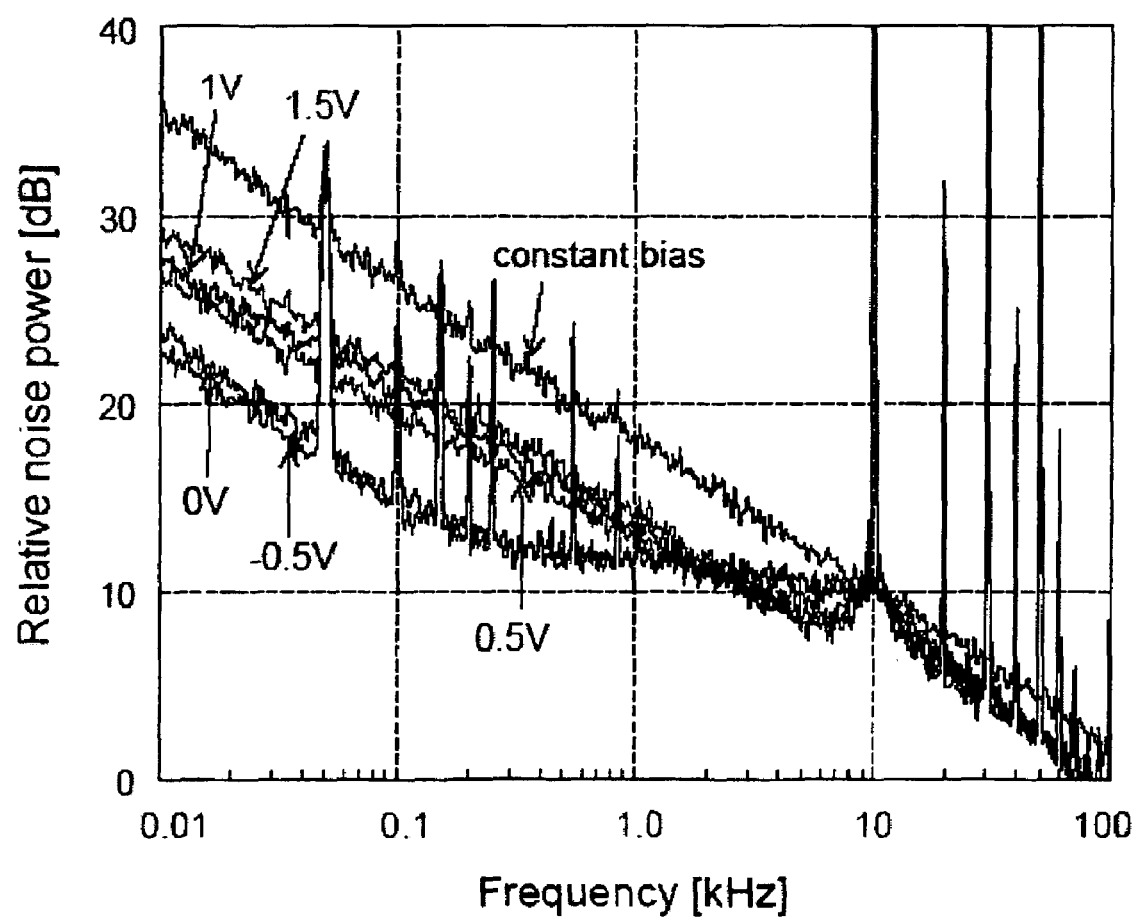
FIG. 5 is a graph illustrating a noise measurement result with respect to the circuit shown in FIG. 4.

As an example, as depicted in the graph shown in FIG. 5, a power of a 1/f noise which shows a greater flicker noise in a lower frequency is decreased when adding the clock pulse 420 rather than when adding a certain DC bias to the gate of the MOSFET 410. In this instance, when a voltage size of the clock pulse 420 changes from 1.5V to −0.5V, the noise power is smaller in the clock pulse 420 driven at a lower voltage.

The exemplary embodiment of the present invention provides a CMOS amplifier which utilizes a reduction of 1/f noise when a gate of a MOSFET is driven via a pulse. The CMOS amplifier according to an exemplary embodiment of the present invention utilizes clock signals. Also, the CMOS amplifier may process a continuous input signal.

Figure 6:
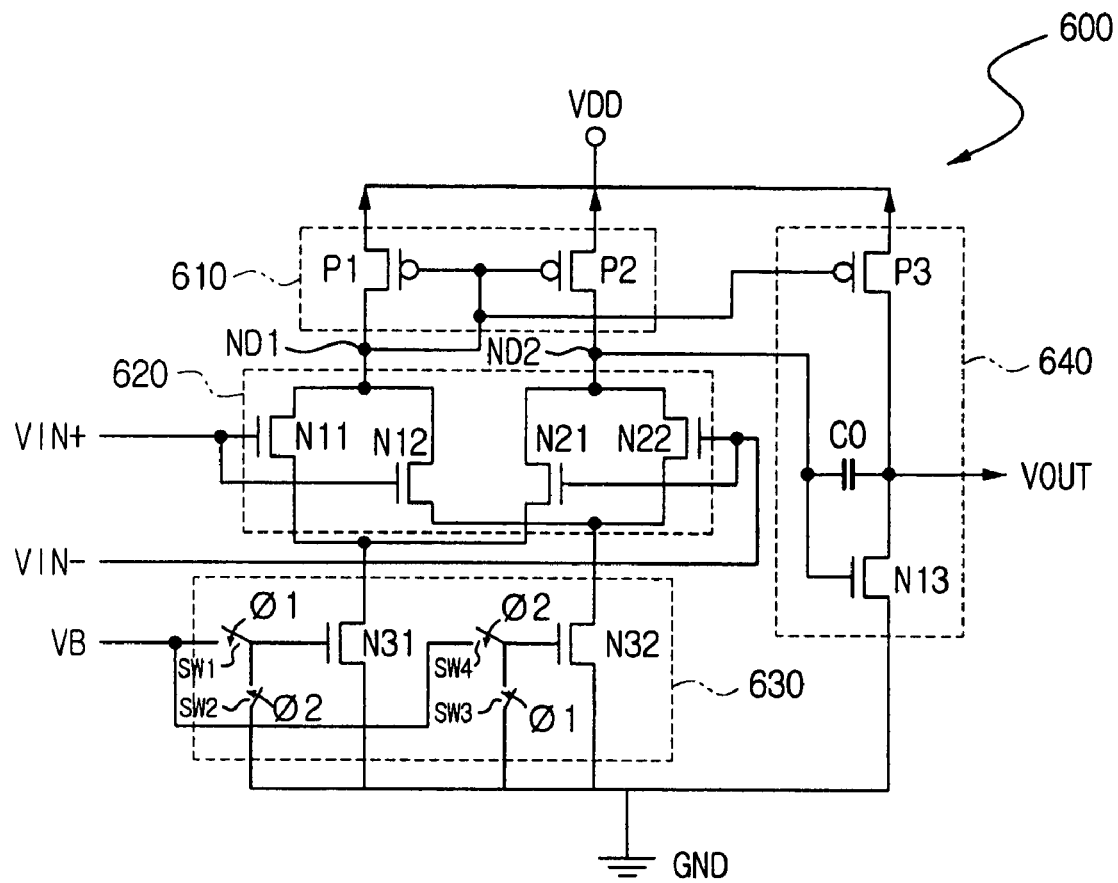
FIG. 6 is a diagram illustrating a CMOS amplifier according to an exemplary embodiment of the present invention.

FIG. 6 is a diagram which illustrates a CMOS amplifier 600 according to an exemplary embodiment of the present invention. Referring to FIG. 6, the CMOS amplifier 600 includes a load circuit 610, a signal input circuit 620, a switch-bias circuit 630 and an output buffer 640.

In this instance, the load circuit 610 includes P-channel MOSFETs P1 and P2. In the MOSFET P1, a source is connected to a first power source VDD, and a gate and a drain are connected with the signal input circuit 620 by a first contact point ND1. In the MOSFET P2, a source is connected to the first power source VDD. Also, a gate is connected to the first contact point ND1 and a drain is connected with the signal input circuit 620 by a second contact point ND2. The most basic devices which constitute the load circuit 610 have been described. However, the present invention is not limited thereto. The load circuit 610 may further include a number of devices, such as a resistor, an inductor, a capacitor and the like. Also, other devices may be further included in the load circuit 610 so that the CMOS amplifier 600 may function as any one of a buffer, a filter, an integrator, and a comparator.

The signal input circuit 620 is connected to the load circuit 610 by the first contact point ND1 and the second contact point ND2, and receives two input signals VIN+ and VIN−. In this instance, the two input signals VIN+ and VIN− are differential signals. Also, when an output end VOUT of the output buffer 640 is connected to only any one terminal of the two input signals VIN+ and VIN−, so as to function as a buffer, only that one terminal between the two input signals VIN+ and VIN− may be inputted.

The signal input circuit 620 includes two pairs of MOSFETs which simultaneously receive the two input signals VIN+ and VIN−, and which are respectively connected to the two contact points ND1 and ND2 connected with the load circuit 610. A pair of MOSFETs N11 and N21 receive the two input signals VIN+ and VIN−, and another pair of MOSFETs N12 and N22 connected to the two MOSFETs N11 and N21 at the two contact points ND1 and ND2 are included in the signal input circuit 620.

The switch-bias circuit 630 includes MOSFETs N31 and N32 connected between a second power source, for example, GND, and the signal input circuit 620. The MOSFET N31 is connected to one pair of MOSFETs N11 and N21 which receive the two input signals VIN+ and VIN−, and functions as a current source in the case of activation of a first clock signal Ø1. The MOSFET N32 is connected to another pair of MOSFETs N12 and N22 which receive the two input signals VIN+ and VIN−, and functions as a current source in the case of activation of a second clock signal Ø2.

The switch-bias 630 includes first to fourth switches SW1 to SW4 which turns/shuts off a bias voltage VB according to the first clock signal Ø1 and the second clock signal Ø2. The first switch SW1 selectively turns/shuts off a bias voltage VB to a gate of the MOSFET N31 according to the first clock signal Ø1. The second switch SW2 selectively turns/shuts off the second power source GND to the gate of the MOSFET N31 according to the second clock signal Ø2.

The third switch SW3 selectively turns/shuts off the second power source GND to the gate of the MOSFET N32 according to the first clock signal Ø1. The fourth switch SW4 selectively turns/shuts off the bias voltage VB to a gate of the MOSFET N32 according to the second clock signal Ø2.

Figure 7:
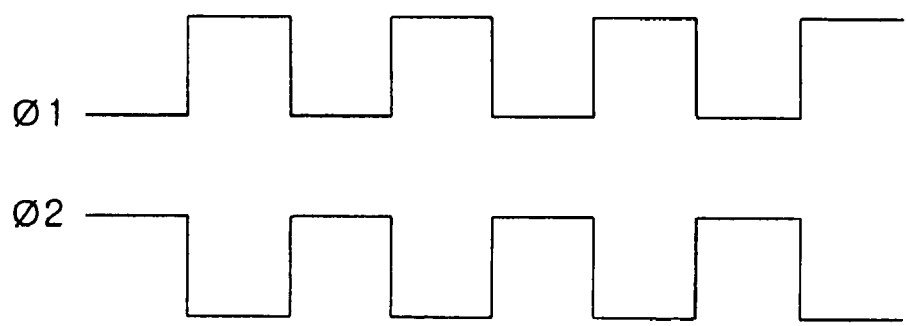
FIG. 7 is a waveform diagram illustrating clock signals for the CMOS amplifier shown FIG. 6.

In this instance, each of the first clock signal Ø1 and the second clock signal Ø2 is a two phase signal which have a different phase with each other, and the phase change of the clock signals is substantially simultaneous as shown in FIG. 7.

Figure 8:
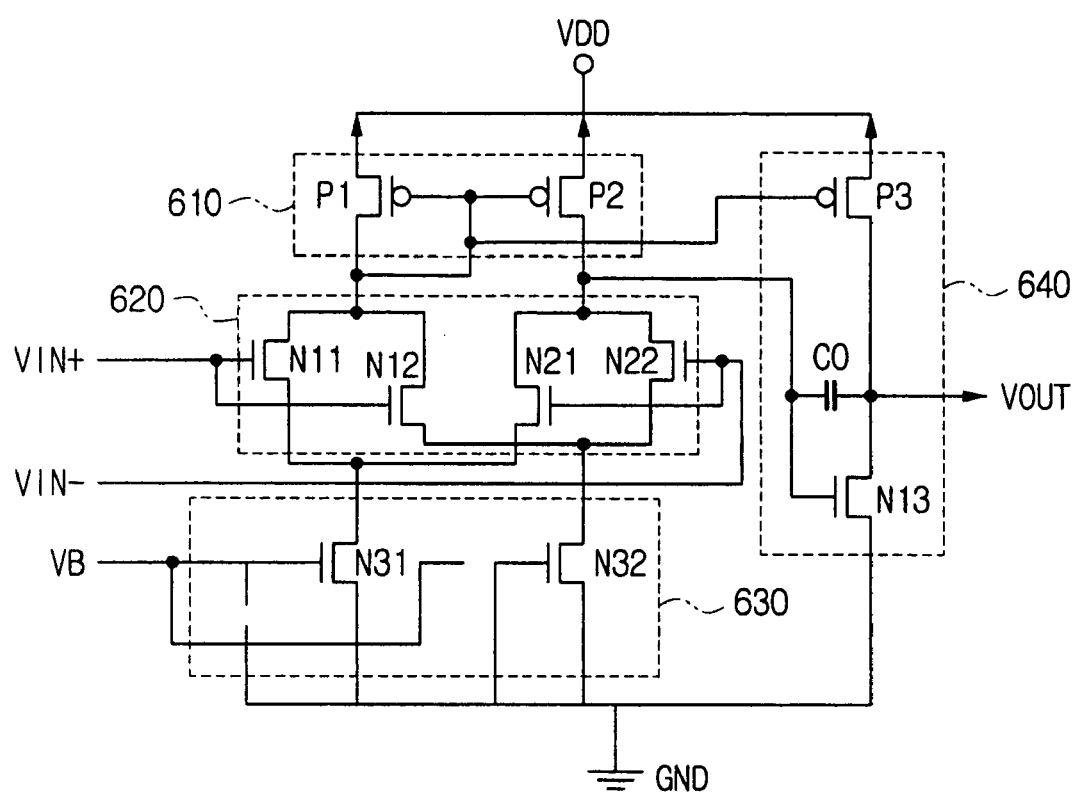
FIG. 8 is a diagram illustrating an operation when a first clock signal is active in the CMOS amplifier shown in FIG. 6.

In the case of activation of the first clock signal Ø1 in FIG. 6, the switches SW1 and SW3 are shorted and the switches SW2 and SW4 are open as shown in FIG. 8. Accordingly, the MOSFET N31 functions as a current source supplying a constant current according to the bias voltage VB, and the MOSFET N32 is turned off.

Figure 9:
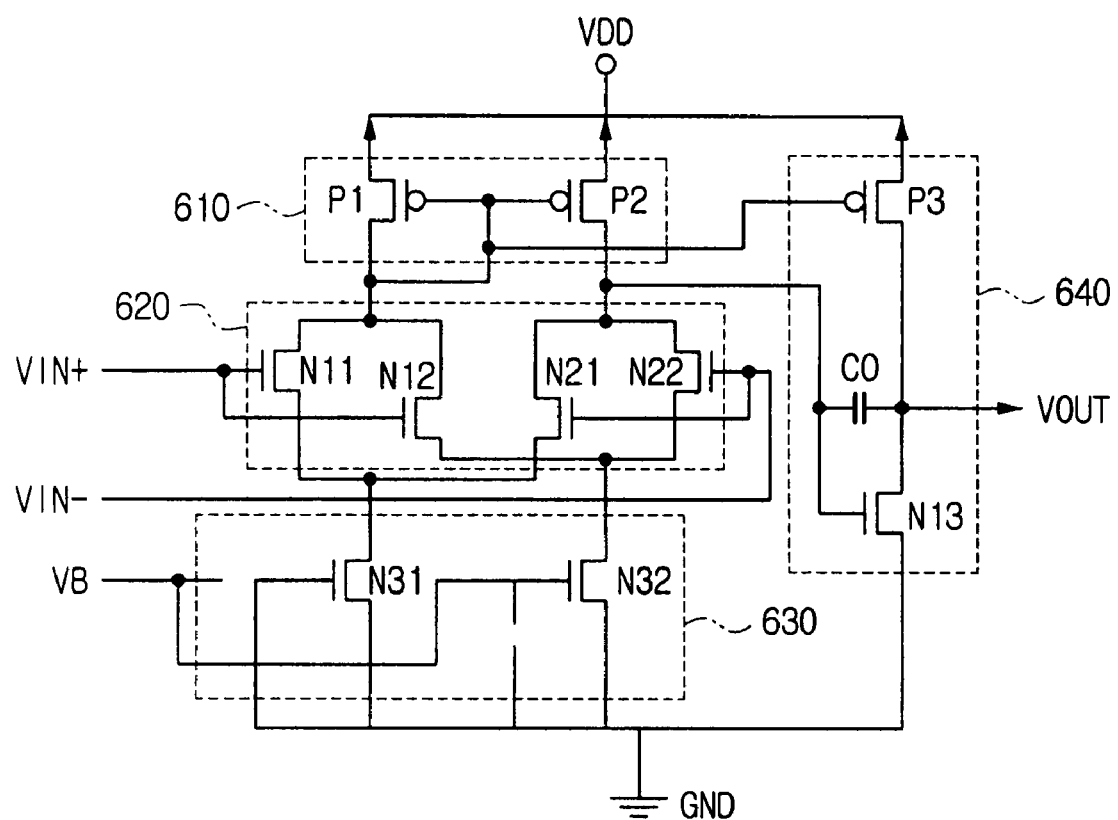
FIG. 9 is a diagram illustrating an operation when a second clock signal is active in the CMOS amplifier shown in FIG. 6.

Also, in the case of activation of the second clock signal Ø2 in FIG. 6, the switches SW2 and SW4 are shorted and the switches SW1 and SW3 are open as shown in FIG. 9. Accordingly, the MOSFET N32 functions as a current source supplying a constant current according to the bias voltage VB, and the MOSFET N31 is turned off.

The CMOS amplifier 600 constructed as above may amplify the two input signals VIN+ and VIN−, and output the amplified differential signals via the two contact points ND1 and ND2 connected between each pair of MOSFETs of the signal input circuit 620 and the load circuit 610. The amplified differential signals to be outputted via the two contact points ND1 and ND2 according to the two continuous input signals VIN+ and VIN− are outputted as signals which have a lower 1/f noise according to the 1/f noise reducing method described in FIG. 4.

The CMOS amplifier 600 may further include the output buffer 640 which may be utilized as any one of a stable buffer, a filter, an integrator, and a comparator.

The output buffer 640 includes a P-channel MOSFET P3, an N-channel MOSFET N13 and a capacitor C0, which receives the amplified differential signals from the two contact points ND1 and ND2 between the load circuit 610 and the signal input circuit 620.

In the P-channel MOSFET P3, a source is connected to the first power source VDD, and a gate is connected to a first contact point ND1 between the load circuit 610 and the signal input circuit 620. Also, a drain is connected to an output terminal VOUT. In the N-channel MOSFET N13, a drain is connected to the output terminal VOUT, and a gate is connected to a second contact point ND2 between the load circuit 610 and the signal input circuit 620. A source is connected to the second power source GND. The capacitor C0 is connected between the second contact point ND2 and the output terminal VOUT.

The output buffer 640 buffers the amplified differential signals received from the two contact points ND1 and ND2. Namely, the output buffer 640 generates and outputs an output signal VOUT which is more stable and has an improved driving power at a constant level.

In the CMOS amplifier 600, the output terminal VOUT may be connected to a terminal, for example, VIN−, of any one of the two input signals VIN+ and VIN−. In this instance, the CMOS amplifier 600 may receive and amplify one input signal from another terminal, for example, VIN+, of the two input signals VIN+ and VIN−, and output the amplified signal to the output terminal VOUT. Namely, the CMOS amplifier 600 may function as a one-input-one-output amplifier. The structure described above may embody a function of an operational amplifier which may be utilized as a buffer, a filter, an integrator, or a comparator. In this instance, the filter indicates an LPF, a high pass filter (HPF), a band pass filter (BPF), etc.

Figure 10:
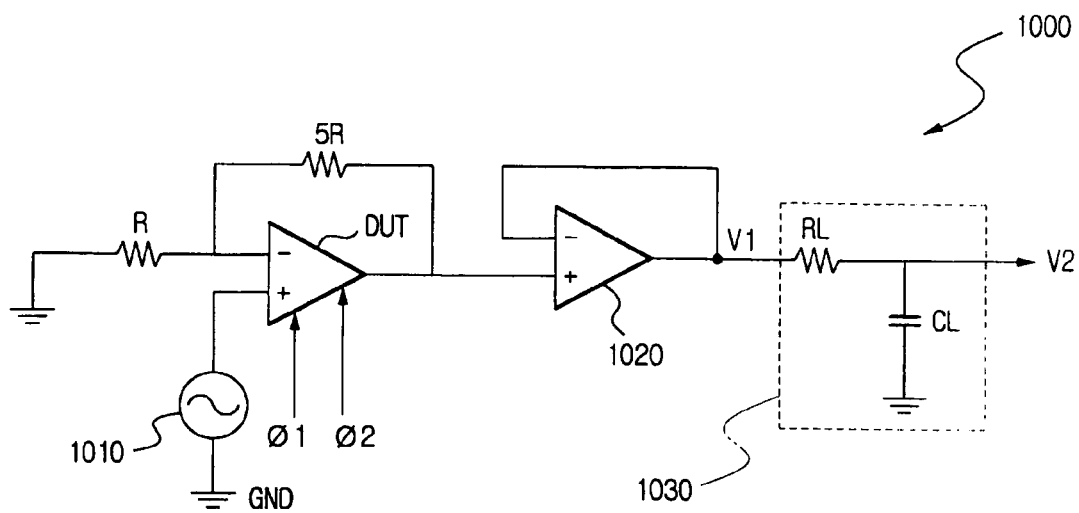
FIG. 10 is a diagram illustrating a circuit for measuring a noise with respect to the CMOS amplifier shown in FIG. 6.

FIG. 10 illustrates a circuit 1000 which measures a noise with respect to the CMOS amplifier 600 of FIG. 6. In this instance, the CMOS amplifier 600 of FIG. 6 is a device under test (DUT) in the circuit 1000. As shown in FIG. 10, resistances R and 5R, an input signal generation circuit 1010 and an amplifier 1020 are provided to measure a low frequency noise of the DUT. Also, a low pass filter (LPF) circuit 1030 is included to measure whether a glitch may be easily removed. In this instance, the glitch may occur when the DUT is driven by clock signals Ø1 and Ø2.

Figure 11:
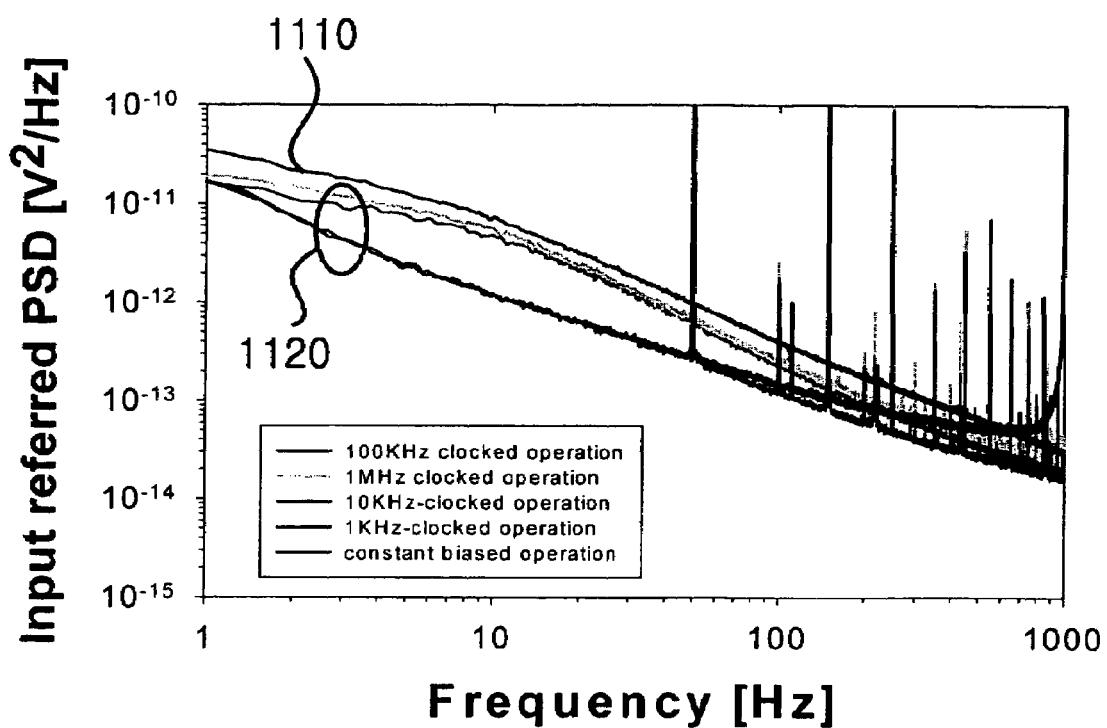
FIG. 11 is a graph illustrating a flicker noise for each frequency with respect to the V1 node shown in FIG. 10.

FIG. 11 illustrates analysis results with respect to a power spectrum density of a 1/f noise in a V1 node, when a continuous signal is inputted from the input signal generation circuit 1010 into any one input of the DUT while the frequency of the clock signals Ø1 and Ø2 is changed. The power spectrum density may be calculated by a fast Fourier transform (FFT) analysis method. As shown in a curve 1110 of FIG. 11, when a circuit which has a current source according to constant bias is utilized as the DUT shown in FIG. 1, the power spectrum density of the 1/f noise is larger than in curves 1120. As shown in the curves 1120, when the CMOS amplifier 600 of FIG. 6 is utilized as the DUT, the power spectrum density of the 1/f noise is being reduced as the frequency of the clock signals Ø1 and Ø2 changes from 1 MHz to 1 KHz.

Figure 12:
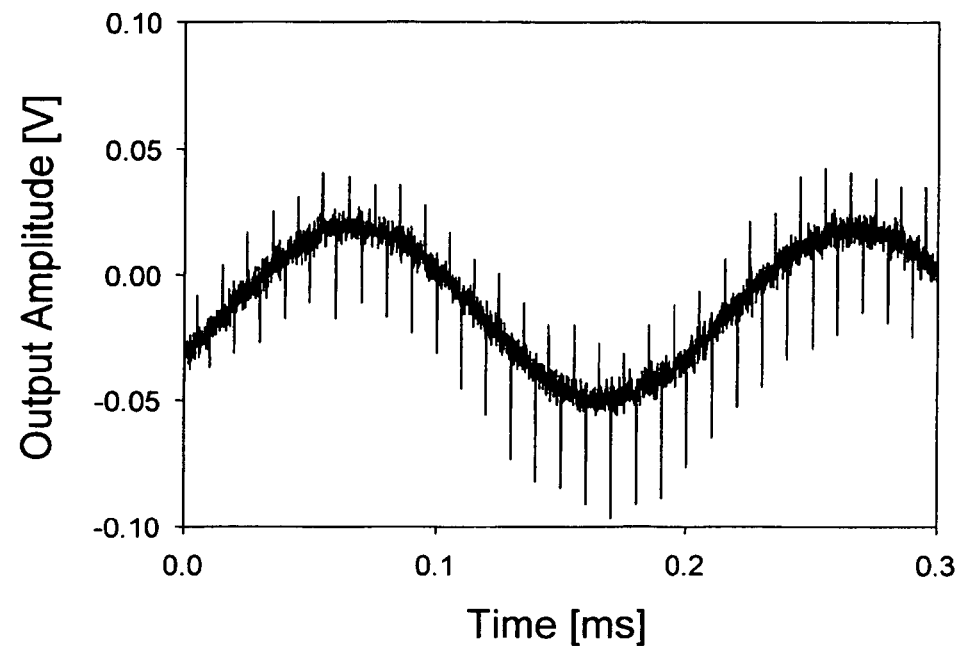
FIG. 12 is a waveform diagram illustrating a glitch existing in a signal of the V1 node shown in FIG. 10.
Figure 13:
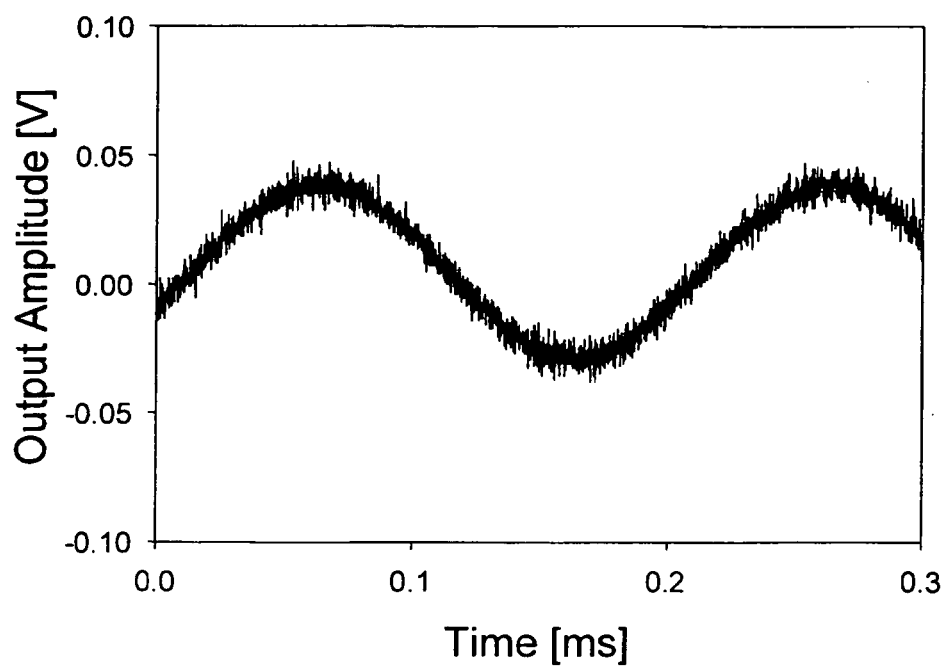
FIG. 13 is a waveform diagram illustrating a glitch reduced in a V2 node shown in FIG. 10.

When the DUT is driven by the clock signals Ø1 and Ø2, a certain degree of glitch appears in the V1 node of FIG. 10, as shown in FIG. 12. However, as illustrated in FIG. 13, the glitch may be significantly removed by the first-order LPF circuit 1030, which includes only one resistance RL and one capacitor CL. As described above, since a glitch may be easily removed by a simple filter, it is expected that the CMOS amplifier 600 of FIG. 6 may be applicable to signal amplification or buffering with a small 1/f noise in a communication system which transmits/receives high speed wireless data, and thereby improved performance of the system may be achieved.

As described above, in the CMOS amplifier 600 according to an exemplary embodiment of the present invention, the load circuit 610 is connected to the signal input circuit 620 which includes two pairs of MOSFETs which simultaneously receive differential signals. In this instance, the MOSFET N31 which is included in the switch-bias circuit 630, is connected to one pair of MOSFETs N11 and N21 which receive the differential signals, and functions as a current source in the case of activation of a first clock signal Ø1. The MOSFET N32 which is included in the switch-bias circuit 630 is connected to another pair of MOSFETs N12 and N22 which receive the differential signals, and functions as a current source in the case of activation of a second clock signal Ø2.

As described above, a CMOS amplifier according to the exemplary embodiments of the present invention processes a continuous signal without regard to a timing of two phase clock signals and improves a low frequency flicker noise. Accordingly, when the CMOS amplifier is utilized in a system which transmits/receives high speed wireless data, such as a mobile phone, a digital multimedia broadcasting (DMB) phone, a personal digital assistant (PDA), and an Ultra Wideband (UWB), the performance of the system may be improved.

The invention may also be embodied as computer readable codes on a computer readable recording medium. The computer readable recording medium is any data storage device that can store data which may be thereafter read by a computer system. Examples of the computer readable recording medium include read-only memory (ROM), random-access memory (RAM), CD-ROMs, magnetic tapes, floppy disks, optical data storage devices, and carrier waves, such as data transmission through the Internet. The computer readable recording medium may also be distributed over network coupled computer systems so that the computer readable code is stored and executed in a distributed fashion.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. An amplifier comprising:

a load circuit connected to a first power source;

a signal input circuit connected to the load circuit and receiving two input signals; and a switch-bias circuit connected between a second power source and the signal input circuit, wherein:

the signal input circuit includes two pairs of Metal-Oxide Semiconductor Field Effect Transistors (MOSFETs) which simultaneously receive the two input signals and are respectively connected to two contact points connected to the load circuit, the switch-bias circuit includes a first MOSFET connected to one pair of MOSFETs of the two pairs of MOSFETs which functions as a current source when a first clock signal is activated, and a second MOSFET connected to another pair of MOSFETs of the two pairs of MOSFETs and which functions as a current source when a second clock signal is activated, and wherein the amplifier amplifies the two input signals and outputs the amplified input signals via the two contact points.

2. The amplifier of claim 1, wherein the two input signals are differential signals.

3. The amplifier of claim 1, wherein the load circuit comprises:

a first MOSFET which has a source connected to the first power source and which has a gate and a drain connected to a first contact point of the two contact points and to the signal input circuit; and a second MOSFET which has a source connected to the first power source, a gate connected to the first contact point, and having a drain connected to a second contact point of the two contact points and to the signal input circuit.

4. The amplifier of claim 3, wherein the first MOSFET and the second MOSFET are P-channel transistors.

5. The amplifier of claim 1, further comprising:

an output buffer connected to the two contact points.

6. The amplifier of claim 5, wherein the output buffer comprises:

a P-channel MOSFET which has a source connected to the first power source, a gate connected to a first contact point between the load circuit and the signal input circuit, and having a drain connected to an output terminal;

an N-channel MOSFET which has a drain connected to the output terminal, a gate connected to a second contact point between the load circuit and the signal input circuit, and having a source connected to the second power source; and a capacitor coupled between the second contact point and the output terminal.

7. The amplifier of claim 6, wherein the amplifier functions as a one-input-one-output amplifier which has a terminal which corresponds to any one of two input signals connected to the output terminal, and receives and amplifies an input signal from another terminal which corresponds to another of the two input signals, and outputs the amplified signal to the output terminal.

8. The amplifier of claim 1, wherein each of the first clock signal and the second clock signal is a two phase signal.

9. The amplifier of claim 1, wherein the first clock signal and the second clock signal have a different phase from each other and a phase change of the clock signals is substantially simultaneous.

10. The amplifier of claim 1, wherein the first MOSFET operates according to a bias voltage and the second MOSFET is turned off when the first clock signal is activated, and the second MOSFET operates according to the bias voltage and the first MOSFET is turned off when the second clock signal is activated.

11. The amplifier of claim 1, wherein the switch-bias circuit comprises:

a first switch which selectively transmits a bias voltage to a gate of the first MOSFET according to the first clock signal;

a second switch which selectively turns off the second power source to the gate of the first MOSFET according to the second clock signal;

a third switch which selectively turns off the bias voltage to a gate of the second MOSFET according to the second clock signal; and a fourth switch which selectively turns off the second power source to the gate of the second MOSFET according to the first clock signal.

12. The amplifier of claim 1, wherein the amplifier is utilized for any one of a buffer, a filter, an integrator, and a comparator.

13. A method of processing a consecutive signal, the method comprising:

selectively operating a first MOSFET as a current source according to a first clock signal, the first MOSFET being connected to a pair of MOSFETs which are connected to a load circuit and which receive two input signals;

selectively operating a second MOSFET as a current source according to a second clock signal, the second MOSFET being connected to another pair of MOSFETs which are connected to the load circuit and which receive the two input signals; and amplifying the two input signals and outputting the amplified input signals via two contact points between the two pairs of MOSFETs and the load circuit.

14. The method of claim 13, wherein the two input signals are differential signals.

15. The method of claim 13, further comprising:

buffering the amplified signals.

16. The method of claim 13, wherein each of the first clock signal and the second clock signal is a two phase signal.

17. The method of claim 13, wherein the first clock signal and the second clock signal have a different phase from each other and a phase change of the clock signals is substantially simultaneous.

18. The method of claim 13, wherein the first MOSFET operates according to a bias voltage and the second MOSFET is turned off when the first clock signal is activated, and the second MOSFET operates according to the bias voltage and the first MOSFET is turned off when the second clock signal is activated.

19. The method of claim 13, wherein the signal processing method is utilized for any one of a buffer, a filter, an integrator, and a comparator.

* * * * *